United States Patent
Radosavljevic et al.

(12)
(10) Patent No.: US 6,198,631 B1
(45) Date of Patent: Mar. 6, 2001

(54) HIGH TEMPERATURE GROUND CONNECTION

(75) Inventors: Dejan Radosavljevic, Lafayette; Michael R. Bryndzia, Baldwinsville, both of NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 09/454,099

(22) Filed: Dec. 3, 1999

(51) Int. Cl.⁷ .................................................... H05K 7/20
(52) U.S. Cl. .................... 361/704; 361/688; 361/719; 174/16.3; 174/51; 165/80.2; 165/185; 200/289; 200/547
(58) Field of Search ................................ 361/676–679, 361/688–690, 702–704, 707, 719, 720, 628, 631, 643; 174/16.1, 16.3; 165/80.2, 185, 104.33; 200/547, 289; 315/291

(56) References Cited

U.S. PATENT DOCUMENTS

| | | | |
|---|---|---|---|
| 3,746,923 | * | 7/1973 | Spira et al. ............................ 315/291 |
| 3,798,506 | * | 3/1974 | English ................................. 361/704 |
| 3,801,874 | * | 4/1974 | Stefani ................................. 361/709 |
| 3,952,178 | * | 4/1976 | Reese et al. ............................ 200/47 |
| 4,068,289 | * | 1/1978 | Ferrigno ................................. 361/714 |
| 4,156,121 | * | 5/1979 | Klein et al. ............................ 200/293 |
| 4,672,229 | * | 6/1987 | Skarman et al. ....................... 307/115 |
| 4,880,950 | * | 11/1989 | Carson et al. ......................... 200/547 |
| 4,972,125 | * | 11/1990 | Cunningham et al. ............... 315/291 |
| 5,315,477 | * | 5/1994 | Schumacher et al. ................. 361/678 |

FOREIGN PATENT DOCUMENTS 2 154 805 * 9/1985 (GB) .

* cited by examiner

Primary Examiner—Leo P. Picard
Assistant Examiner—Boris L. Chervinsky
(74) Attorney, Agent, or Firm—Wall Marjama & Bilinski

(57) ABSTRACT

A wiring device, and more particularly a heat generating wiring device such as a dimmer, includes a heat sink in thermal contact with a heat-generating electrical component and the ground terminal to dissipate heat therefrom. The ground terminal is recessed in the housing to prevent a ground screw from contacting external insulation but without impeding connection of the ground wire to the ground terminal.

22 Claims, 4 Drawing Sheets

HIGH TEMPERATURE GROUND CONNECTION

FIELD OF THE INVENTION

This invention relates generally to wiring devices and more particularly to heat generating wiring devices, such as light dimmers, and even more particularly to improved ground terminals for such devices.

BACKGROUND OF THE INVENTION

Some wiring devices, such as light dimmers, generate substantial heat during operation. A 1000 watt light dimmer can, under certain operating conditions, generate temperatures exceeding 100° C.

Electrical code requirements limit the temperatures of certain exposed wiring devices, such as dimmers. With a few exceptions, portions of dimmers that are exposed to the occupants of buildings or houses cannot exceed 60° C. under normal operating conditions. Even inaccessible portions of wiring devices have temperature requirements. In order to avoid damaging the insulation on building wiring, no portion of a dimmer more than ¼" from the main heat sink can exceed 75° C. This rule protects the insulation of field wiring, which routinely comes into contact with portions of light dimmers during installation.

A particular problem relates to the heat generated at an electrical component such as a triac. This is dealt with in prior art by mounting it far from the circuit board to which it is electrically connected.

A further problem relates to the control of the temperature of the ground strap. Since the ground strap is physically connected to the main heat sink, it tends to rise too close to the heat sink temperature. Various techniques are employed to reduce the temperature of the ground strap, such as physically locating it on the opposite side of the device from the heat generating components, usually scrs or triacs, but these techniques impose design limits on the devices that are undesirable.

SUMMARY OF THE INVENTION

We have developed a new construction for a ground terminal for a heat generating wiring device such as a light dimmer that overcomes the problems of the prior art. Rather than attempting to limit the temperature of field accessible portions of the ground terminal of a light dimmer, we have developed a construction that limits the accessibility of the ground terminal, so that higher temperatures can be tolerated.

In accordance with one aspect of the invention, a wiring device such as a dimmer includes a heat sink in thermal connection with a heat generating component such as a triac, so that the generated heat is dissipated over the entire area of the heat sink.

In accordance with another aspect of the invention, the device includes a ground strap which is integrally formed with the heat sink.

In accordance with another aspect of the invention, the device includes a ground terminal that is physically isolated from field wiring by a non-thermally conductive, and preferably non-electrically conductive housing. The housing completely encloses the ground strap except for providing access to the ground terminal at the connection point where a terminal screw is threaded through the ground terminal. The ground screw is recessed to prevent physical contact with field wiring, thus the wiring insulation is protected from being overheated by the heat generated at the ground terminal.

In accordance with another aspect of the invention, the non-thermally conducting housing includes a hole sized to receive the ground wire, so that it can be secured to the ground terminal with the ground terminal screw.

In accordance with another aspect of the invention, the non-thermally conducting housing includes a hole sized to receive the electrical conductor of a field wire, but sufficiently small to prevent the insulation of the field wire from being received by the hole. The insulation is thereby kept away from contact with heat sources within the housing.

DETAILED DESCRIPTION OF THE PREFERRED EMBODIMENT

Figure 1:
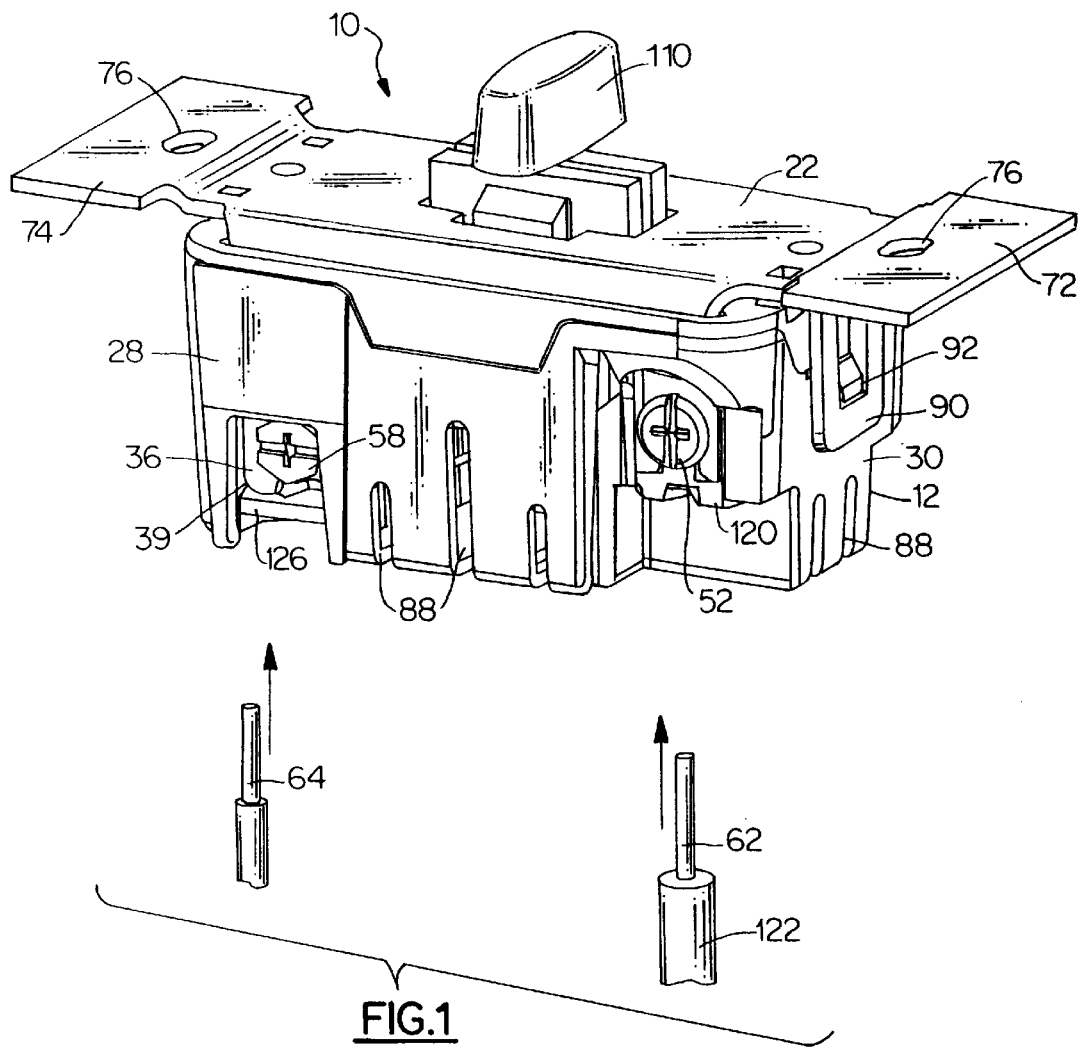
FIG. 1 shows a perspective view of an electrical control box of the present invention.
Figure 2:
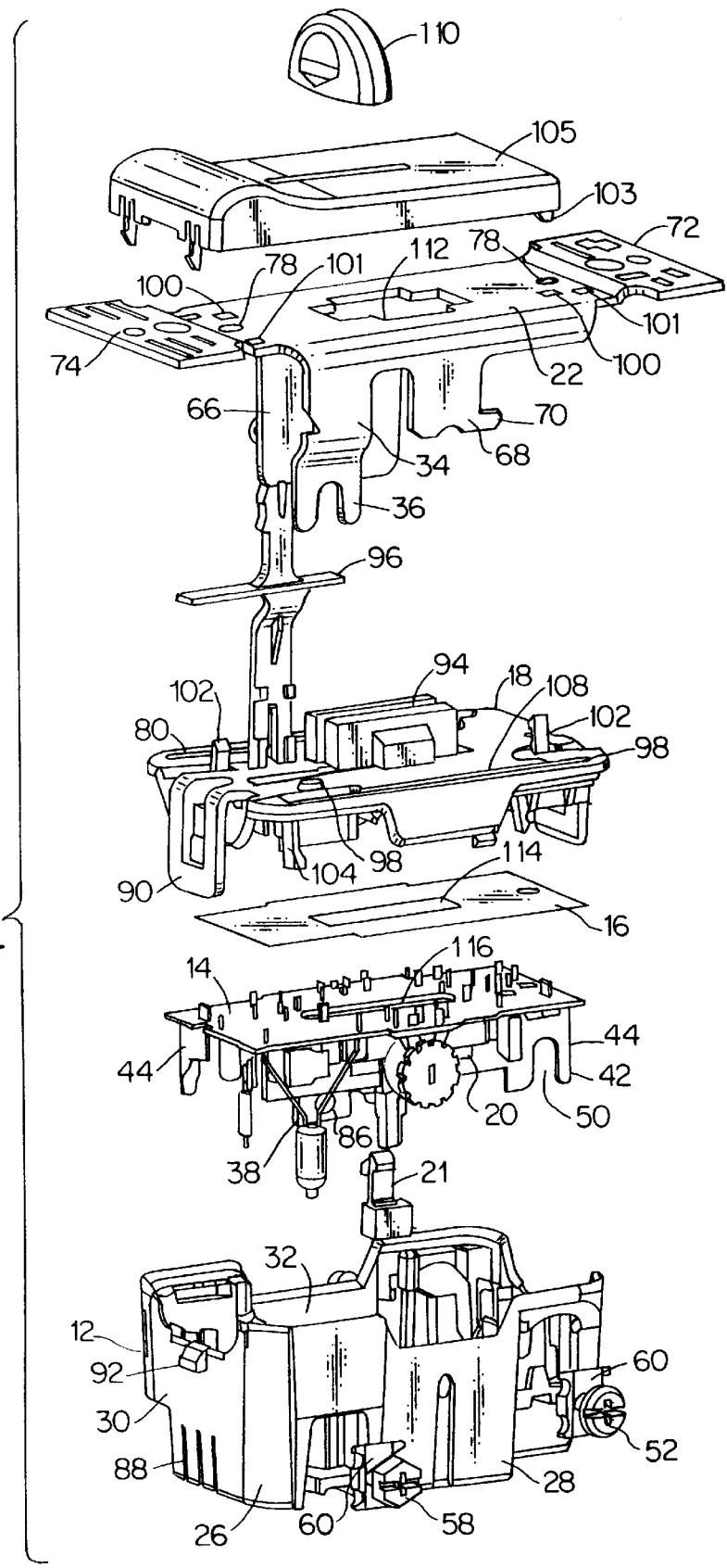
FIG. 2 shows an exploded perspective view of the electrical control box.

The embodiment of this invention shown in FIGS. 1 and 2 is an electrical control box 10 having a heat-generating power control device, in particular a dimmer light switch. The electrical control box is connected to external wiring by screw terminals rather than lead lines.

The box 10 is constructed so that areas which generate considerable heat are isolated from electrical insulation which covers external power wiring, thereby ensuring that the insulation does not overheat and degrade.

Figure 3:
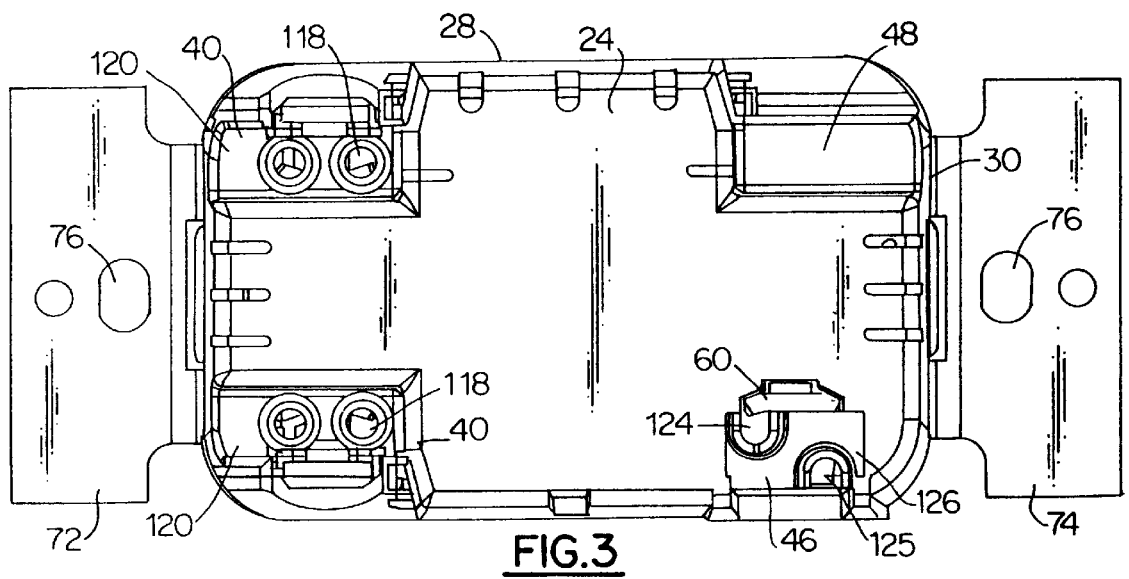
FIG. 3 shows a housing of the control box in bottom view.

The electrical control box 10 comprises a housing 12, a printed circuit board 14, an optional barrier plate 16, a cover 18, a slide potentiometer 20 and a heat sink 22. The housing has a base 24, side walls 26 which include sides 28 and ends 30, and an open face 32. As shown in FIG. 3, the housing 12 of the illustrated embodiment includes a recess at each corner as viewed from a direction perpendicular to the base 24. For purposes of description, positional terms will be relative to the base 24 of the housing. The housing 12 is constructed of a thermally non-conducting, and preferably electrically non-conducting, material. A suitable material is a plastic such as polycarbonate, which is inexpensive, provides the necessary stiffness and strength, and does not change properties with elevated temperatures encountered in light dimmer applications. Of course, other insulating materials which are sufficiently sturdy may be used.

The heat sink 22 serves to receive heat generated by components of the device, and to dissipate the heat over the entire area, thus preventing the build-up of localized extreme temperatures. In other words, heat is conducted away from heat-generating locations, such as components of the circuit board and dissipated over the area provided by the heat sink.

Prior wiring devices typically include a distinct ground strap to provide an electrical connection with a ground wire, but in this invention a ground strap 34 is integrally formed with the heat sink 22. More specifically, the ground strap 34 extends downwardly from, and is integrally formed with, a planar major area 54 of the heat sink. The ground strap 34 has an inverted U-shaped opening 56 for connection with a ground terminal screw 58.

Various components of the circuit board generate heat, especially for light dimmer switches, such as a triac, transistor, integrated circuit, or other active device. Of special concern is the heat generated by a triac. In previous devices employing a triac, the triac was mounted far from the circuit board to which it was electrically connected, in order to prevent heat generated from the triac from deleteriously affecting the circuit board. This, in turn, required that the triac have long lead lines that impeded heat transfer. The long lead lines of the triac required an extra labor intensive manual soldering step for installation of the triac. An objective of the present invention is to dissipate the heat generated by an electrical component such as a triac efficiently enough to allow the component to be mounted with other electrical components on a circuit board of the box instead of its having to be far removed from the circuit board, thus avoiding the need for long lead lines. With the present invention, the triac 38 is directly soldered to the circuit board, facilitating simpler manufacturing and assembly. This also permits the circuit board 14 to be mounted parallel to the open face 32 and to the base 24 of the housing, whereas various prior devices for light dimmer switches required the circuit board to be mounted perpendicularly.

Figure 4:
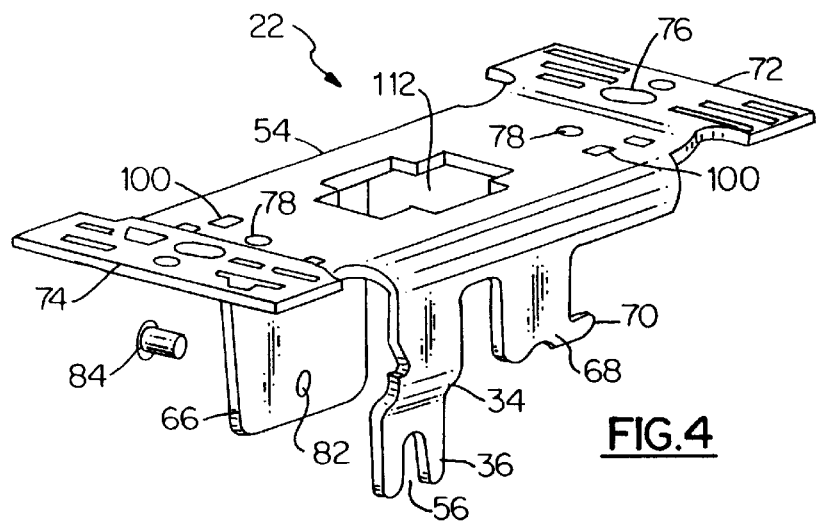
FIG. 4 shows a heat sink.

To conduct heat generated by the triac 38 away from the circuit board, heat sink 22 includes an integral, downwardly extending flap 66. The flap 66 is in thermal contact with the triac 38 to absorb the heat produced by the triac. As best shown in FIG. 4, the flap 66 has an aperture 82 for receiving a fastener, such as eyelet 84. The flap 66 and the triac 38 are secured into thermal contact by the eyelet 84 which passes through corresponding aperture 86 on a mounting tab of the triac 38. Accordingly, heat from the triac 38 is transferred to the flap 66 and is dissipated over the area 54 of the heat sink 22.

The heat sink 22 is preferably formed from a generally flat thin metal stamping of a thermally conductive metal such as aluminum. The heat sink further includes a second integral flap 68 that provides additional surface area for dissipation of heat. The interior of the assembly is further prevented from becoming overheated by ventilation slots such as 88 in the sides 28 and ends 30 of the housing.

In the illustrated embodiment, integrally formed with planar area 54 of the heat sink 22 are two ends 72 and 74 which extend beyond the perimeters of the housing 12. The ends 72, 74 have elongated apertures 76, which receive a fastener, such as a screw, to mount the assembled control box into a wall junction box.

Two power recesses 40 are disposed at the same end 30 of the housing and accommodate power terminals 42 which are joined to the circuit board 14 through metal connectors 44. Near the opposite end 30 of the housing, a ground recess 46 accommodates the ground terminal 36. In the illustrated embodiment, a fourth recess 48 is blank but a third power terminal may be included in this recess if the housing is to be used in another type of device such as a three-way switch.

The power terminals 42 are disposed in the power recesses 40 so that they are somewhat closer to the open face 32 than to the base 24 of the housing 12. The ground terminal 36 is close to the base 24. As best seen in FIG. 1, the ground terminal 36 may be more fully recessed within the housing 12 than the power terminals. 2. Preferably, the ground screw 58, when engaged with the threaded aperture in the ground terminal pressure plate 60, is completed recessed in the side wall so as to prohibit contact with other wiring external of the housing. In the illustrated embodiment, the ground terminal recess is formed between two parallel internal walls 39, extending inwardly from the side wall of the housing with a back wall connecting these two internal walls. These two internal walls and the back wall of the recess separate the recess from the interior of the housing, and the two internal walls 39 provide sufficient depth of the recess to enclose the ground screw 56. A bottom wall, or downwardly facing partition 126, extends between the two parallel internal walls.

The circuit board 14 is disposed somewhat below and in a plane parallel to the open face 32 of the housing and is supported by structural members internal to the housing. The power terminal 42 is at the remote end of the connector 44 which extends downward from the circuit board 14. It has an open-ended aperture 50 in the form of an inverted U for connection with a power terminal screw 52.

The ground terminal 36 is located at the end of the ground strap 34 which is integral with the heat sink 22 and extends downward from a planar major area 54 thereof. The ground strap 34 has an inverted U-shaped opening 56 for connection with a ground terminal screw 58.

The power terminal screws 52 and ground terminal screw 58 engage threaded holes in the pressure plates 60 retained in the corresponding recess behind the power terminal connector 44 or ground strap 36. For the ground terminal, the U-shaped opening 56 of the ground strap is received between the head of the ground screw 58 and the corresponding pressure plate 60. In assembling the device, the pressure plates 60 are inserted into the recesses, and once the cover 18 is placed in the position, the pressure plates are loosely retained in the recesses until the power or ground screw is tightened. External power wiring 62 is received between the appropriate terminal and pressure plates 60, where it is firmly secured by tightening the terminal screw into the pressure plate 60.

The power terminal screws 52 and the ground terminal screw 58 are all accessed from the corresponding recesses in the exterior sides 28 of the housing. The recess at each functioning terminal is accessed from the exterior of the assembly only in the direction from which the terminal screw enters; in the other directions it is bounded by a partition wall which is structurally integral with the housing. Holes 118 are provided in a downward-facing partition 120 of each power recess to receive external wiring and guide the wiring between the terminal plate 44 and the corresponding pressure plate 60. The holes 118 are sized to receive stripped power wire 62 for connection at the terminal, but to exclude the much bulkier insulation 122 around a power wire. Thus the insulation is kept well apart from heat generating areas within the box. Similarly, openings 124 and 125 are provided in a downward facing partition 126 of the ground recess to receive external ground wiring. Opening 124 is arranged such that when a ground wire 64 is inserted into this opening, the ground wire is guided between the pressure plate 60 and the ground terminal 36. Opening 125 is arranged Such that when a ground wire 64 is inserted into this opening, the ground wire is guided between the ground terminal 36 and the head of the ground screw 58. Thus, an installer has the option of inserting the ground wire into either opening 124 or 125.

Turning now to the overall structure of the control box, the cover 18 is provided to protect the circuit board 14, to secure the circuit board 14 within the housing 12, and to insulate the circuit board 14 and wiring internal to the housing 12. The cover 18 is secured to the housing 12 by snaps 90 on opposing sides of the cover which are releasably retained by mating snap projections 92 of the housing 12.

The cover has a raised central portion through which an aperture 94 is formed to allow passage of a slide coupling 96. Spacers 98 maintain the distance between the heat sink 22 and the surface of the front cover 18 to promote air circulation and cooling of the heat sink 22 on both sides.

Figure 6:
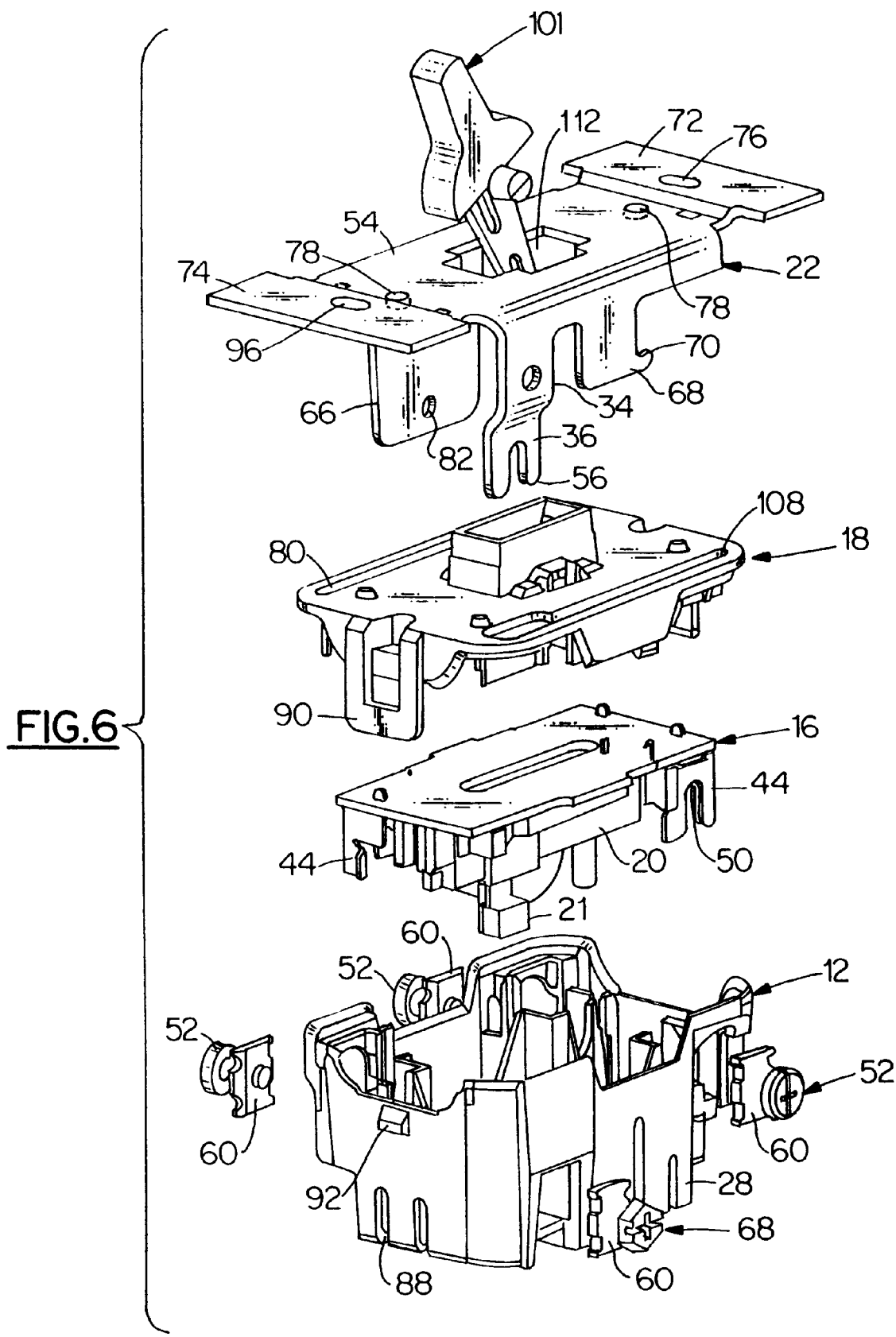
FIG. 6 shows an exploded perspective view of an electrical control box employing a toggle switch.

The heat sink 22 fits atop the cover 18. Snap apertures 100 permit connection of the heat sink 22 to the cover 18 by allowing passage of clips 102 to retain the heat sink to the cover 18. Three openings 101 in the surface 54 of the heat sink are provided to receive snaps 103 of an optional decorator cover 105 for a slide dimmer switch. Threaded openings 78 in the surface 54 are provided for mounting a decorative face plate, in the case where a toggle dimmer switch is used (FIG. 6). Clips 104 project from the cover 18 to retentively connect to the circuit board 14. In addition to the side aperture 80 which allows passage of the flap 66 that engages with the triac 38, the cover 18 also has a second side aperture 108 for passage of the ground strap 34 and the second flap 68. The protuberance 70 of the second flap 68 snaps against a structural member of the cover 18 to provide a further securing point.

The slide coupling 96 provides a connection between the slide potentiometer 20 mounted on the circuit board and an exterior knob 110 by which a user operates the control box 10, the lower end of the slide coupling 96 being connected to the slide potentiometer through link actuator 21. The coupling also passes through corresponding apertures 112, 114 and 116 in the heat sink, the barrier sheet and the circuit board, respectively.

The heat sink is additionally secured when the U-shaped apertures of the power terminals 42 and the ground terminal 36 are engaged with the corresponding terminal screws which are tightened into the pressure plates 60.

The optional barrier plate 16 may be placed over the printed circuit board 14. Generally, the barrier plate 16 will be used only on 1000 W dimmers, and it is preferably made of fish paper or other flame retardant, electrically insulating material.

FIG. 6 illustrates an embodiment similar to that shown in FIGS. 1 and 2, expect employing a toggle dimmer switch assembly 101. As in the embodiment employing a slide dimmer switch, the upper end of the switch assembly includes an external actuator by which a user actuates the devices, and a lower end is connected to the slide potentiometer 20 through link actuator 21.

Figure 5:
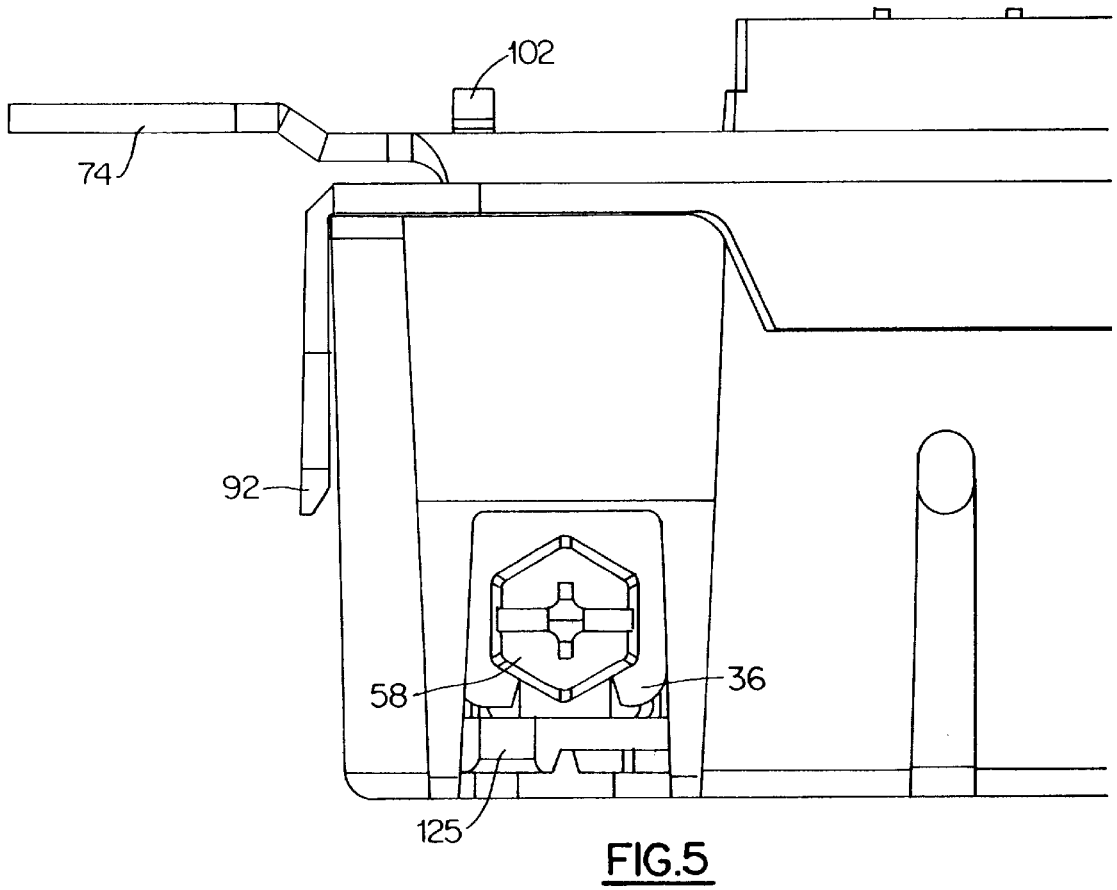
FIG. 5 shows detail at a recess in a side view of the housing.

Accordingly, thermally sensitive material such as external wiring insulation is shielded from potential sources of excessive temperatures. Notable sources of heat is triac 38. The insulation 122 around the power conductors 62 is potentially degradable if overheated, and this is protected in the present invention by the disposition and the configuration of the recesses. In particular, the ground strap 34 is mostly enclosed within the box, and that part of it which is exposed at the ground terminal 36 is recessed, along with the ground screw 58. Nevertheless, the ground screw 58 remains fully accessible to the user, as can be seen in FIGS. 1 and 5.

The UL and CSA limit the temperature of any surface that can get in contact with insulation of field wiring to 75° C. On 1000 W units, the temperature of ground screw terminal 58 can reach above 75° C. Because the ground 58 may reach such elevated temperature, the present device recesses the ground terminal within the housing and secludes it from power wiring, so as to prevent insulation of power wiring from contacting the ground terminal or the ground screw.

Furthermore, insulation around the power wire is prevented from entering the interior of the box, since the hole 118 which receives the power wire 62 at the power terminal 42 is too small to admit the insulation. Thus the insulation is protected from direct exposure to heat sources within the housing 12.

Thus, the present invention provides physical barriers which prevent the insulation 122 of a power conductor 62 from direct contact with concentrated sources of heat, either at the ground terminal 36 or within the housing 12.

While the invention has been described with reference to preferred embodiments, it will be understood by those skilled in the art that various changes may be made and equivalents may be substituted for elements thereof without departing from the scope of the invention. In addition, many modifications may be made to adapt a particular situation of material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed:

1. An electrical control device, comprising:
a housing including a recess in an exterior of the housing;
a ground terminal in the recess of the housing, said ground terminal accessible from the housing exterior for connection to a ground wire while sufficiently recessed to prevent contact with other external wiring;
the housing including a base, side walls extending from the base, and an open face, wherein the ground terminal is recessed within a side wall;
the ground terminal including a pressure plate and a ground screw received in an aperture of the pressure plate, wherein the ground screw is recessed in the side wall when engaged in the pressure plate aperture; and
a ground strap which includes an end engaged between the pressure plate and the ground screw, wherein the ground strap includes a planar surface having a first integral extension connected to the ground terminal, and a second integral extension connected to a heat generating electrical control component enclosed within an interior of the housing.

2. The electrical control device of claim 1, wherein the ground strap is made of a thermally conductive metal, and the heat generated by electrical control component is transferred to the planar surface.

3. The electrical control device of claim 2, wherein the housing is made of a thermal and electrical insulating plastic.

4. The electrical control device of claim 3, wherein a side wall of the housing includes vent openings.

5. The electrical control device of claim 4, wherein the recess is formed between two parallel internal walls extending inwardly from a side wall of the housing, and a back wall connecting the two internal walls, the two internal walls and the back wall of the recess insulating the recess from the interior of the housing.

6. The electrical control device of claim 5, wherein a bottom wall extends between the two internal walls and includes an opening, for receiving and guiding a ground wire between the pressure plate and the ground strap.

7. The electrical control device of claim 5, wherein a bottom wall extends between the two internal walls and includes an opening for receiving and guiding a ground wire between the ground strap and a head of the ground screw.

8. The electrical control device of claim 1, further comprising a circuit board enclosed within the housing and in connection with the heat generating component.

9. The electrical control device of claim 8, further comprising power terminals mounted in the housing, each power terminal including a terminal plate connected to the circuit board, a terminal screw and a pressure plate having an opening for engaging the terminal screw.

10. The electrical control device of claim 8, wherein the housing includes a base, side walls extending from the base, and an open face, and wherein the base includes holes adjacent each power terminal for receiving and guiding wiring between the power terminal plate and the corresponding pressure plate.

11. The electrical control device of claim 10, wherein the holes in the base adjacent the power terminals have a diameter sized to accept stripped power wiring but not wiring insulation.

12. The electrical control device of claim 10, further comprising a slide potentiometer mounted on the circuit board, and a dimmer switch actuator linked to the slide potentiometer.

13. An electrical control device comprising:

(a) a housing comprising a base, side walls and an open face;

(b) power terminals and a ground terminal mounted in recesses in an exterior of the housing, the ground terminal recess being remote from the power terminal recesses;

(c) a circuit board electrically connected to the power terminals and enclosed in an interior of the housing, the circuit board including a heat generating electrical component; and (d) a metal heat sink comprising a planar surface, a first extension integral with and extending from the planar surface to the ground terminal recess to form the ground terminal, and a second extension integral with and extending from the planar surface to the housing interior and in thermal connection with the heat generating electrical component.

14. The electrical control device of claim 13, comprising a pressure plate located behind the ground terminal and a ground screw in threaded engagement with the pressure plate.

15. The electrical control device of claim 13, wherein an opening is formed in the housing base adjacent the ground terminal recess, the opening being located to receive a ground wire and guide the ground wire between a head of a ground screw and the ground terminal.

16. The electrical control device of claim 13, wherein an opening is formed in the housing base adjacent the ground terminal recess, the opening being located to receive a ground wire and guide the ground wire between the ground terminal and a pressure plate in threaded engagement with a ground screw.

17. The electrical control device of claim 16, wherein the ground terminal recess has sufficient depth that the ground screw is completely recessed within the housing when fully engaged with the pressure plate.

18. The electrical control device of claim 13, wherein a circular hole is formed in a lower partition wall of each power terminal recess, the circular hole located to guide a power wire between the power terminal and a corresponding pressure plate.

19. The electrical control device of claim 18, wherein the diameter of each circular hole is sufficiently large to receive stripped power wire and sufficiently small to not accept wiring insulation.

20. The electrical control device of claim 13, wherein the housing is made of a thermally and electrically insulating plastic.

21. The electrical control device of claim 13, further comprising a cover disposed between the circuit board and the planar surface of the metal heat sink, the cover including snap-fit projections to engage with corresponding projections on the housing side walls.

22. The electrical control device of claim 21, further comprising a slide potentiometer mounted on the circuit board, and a dimmer switch actuator, an upper end of which extends through an aperture in the cover and the planar surface of the heat sink, and a lower end of which is linked to the slide potentiometer.

* * * * *